United States Patent
Akke et al.

(10) Patent No.: US 8,395,373 B2
(45) Date of Patent: Mar. 12, 2013

(54) PHASOR ESTIMATION DURING CURRENT TRANSFORMER SATURATION

(75) Inventors: Magnus Akke, Lund (SE); Björn Westman, Västerås (SE); Henrik Ashuvud, Västerås (SE)

(73) Assignee: ABB Technology AG (CH)

( * ) Notice: Subject to any disclaimer, the term of this patent is extended or adjusted under 35 U.S.C. 154(b) by 246 days.

(21) Appl. No.: 12/892,607

(22) Filed: Sep. 28, 2010

(65) Prior Publication Data

US 2011/0025303 A1 Feb. 3, 2011

Related U.S. Application Data (63) Continuation of application No. PCT/EP2008/053749, filed on Mar. 28, 2008.

(51) Int. Cl.
*G01R 15/18* (2006.01)

(52) U.S. Cl. .......... 324/127; 324/547; 324/726; 702/72; 702/57; 702/79; 702/81; 702/183

(58) Field of Classification Search .................. 324/127, 324/547, 726; 702/72, 57, 79, 81, 183
See application file for complete search history.

(56) References Cited

U.S. PATENT DOCUMENTS

| | | | |
|---|---|---|---|
| 6,040,689 A | 3/2000 | Gluszek | |
| 6,072,310 A | 6/2000 | Krebs et al. | |
| 2003/0062887 A1* | 4/2003 | Lau | 324/127 |
| 2005/0094344 A1 | 5/2005 | Kang et al. | |
| 2005/0140352 A1 | 6/2005 | Allain et al. | |

FOREIGN PATENT DOCUMENTS

| | | |
|---|---|---|
| DE | 2339932 A1 | 2/1975 |
| DE | 19928192 A1 | 12/2000 |
| EP | 0506035 A1 | 9/1992 |
| EP | 0980129 A2 | 2/2000 |
| JP | 54144940 A | 11/1979 |
| WO | 9313581 A1 | 7/1993 |

OTHER PUBLICATIONS

Kang et al.; "A compensation Algorithm for the Distorted Secondary Current of a Current Transformer", Eighth IEEE International Conference on Development in Power System Protection, 2004, p. 140-143 (abstract only).
D-G Lee et al.; "Autoregressive Model-based Compensation Method for the Saturated Secondary Current of a Current Transformer"; Proceeding (521) European Power and Energy Systems, 2006, p. 287-291(abstract only).
International Preliminary Report on Patentability; PCT/EP2008/053749; Aug. 2, 2010; 14 pages.
International Search Report and Written Opinion of the International Searching Authority; PCT/EP2008/053749; Nov. 25, 2008; 11 pages.

* cited by examiner

*Primary Examiner* — Huy Q Phan
*Assistant Examiner* — Temilade S Rhodes-Vivour
(74) *Attorney, Agent, or Firm* — St. Onge Steward Johnston & Reens LLC (57) ABSTRACT

A method, device and computer program product for determining at least one property of a current ($I_p$) running through the primary winding of a transformer operating in saturation using an unreliable detected current ($I_s$) running through the secondary winding of the transformer. According to the invention a first reliable extreme point (EP1) of a cycle of the current in the secondary winding is detected and compared with an absolute time reference. Based on the comparison a first property of the current running through the primary winding in the form of the phase angle is then determined.

13 Claims, 3 Drawing Sheets

PHASOR ESTIMATION DURING CURRENT TRANSFORMER SATURATION

CROSS-REFERENCE TO RELATED APPLICATIONS

The present application is a continuation of pending International patent application PCT/EP2008/053749 filed on Mar. 28, 2008 which designates the United States, the content of which is incorporated herein by reference.

FIELD OF THE INVENTION

The present invention relates to the computation of phasors from current waveforms measured in an electric power system, and then computation of such phasors from waveforms distorted by current transformer saturation. The invention more particularly concerns a method, device and computer program product for determining at least one property of a current running through the primary winding of a transformer operating in saturation.

BACKGROUND OF THE INVENTION

The magnitude of currents distributed in electrical power systems are often in the order of hundreds or thousands of amperes. It is not feasible to connect current measuring monitoring or protection devices directly to such high currents. Therefore, current transformers are used to transform the currents to magnitudes applicable to said monitoring or protection devices These transformers are not ideal, however. Above certain current levels they exhibit saturation phenomena which distort the transformation.

Such saturation will in most cases occur when a current being monitored in the system does not behave as anticipated. Such deviating behaviour may also occur because a fault occurs in the system. It is furthermore often in this type of situation that a correctly detected property of the current is most important.

Most current measuring, monitoring and protection devices have to deal with this imperfection in one way or the other. Some devices that may suffer a lot because of this are current measuring protective devices. They are assigned to take action based on the current during the period of time when the saturation phenomenon may be in its worst state.

It is common in protective devices to have a current signal filtered by a pair of filters that reveal the phasor representation of the signal; that is, a complex, magnitude/phase, representation of the signal. The phasor is typically the operative quantity for various functions within the protective device. The current transformer saturation may cause significant errors in the phasor estimation, unless sufficient measures are taken.

The nature of the current transformer saturation phenomenon is such that, during the intermittent periods when it occurs, the transformed (secondary) current waveform deviates significantly from the non-transformed (primary) current waveform, which it is expected to reproduce.

The normal way to handle this is through trying to fully restore the deviating portions of the secondary current waveform to correctly replicate the primary current waveform, thereby providing a secondary current signal that is apparently not affected by the saturation. Conventional filtering of this restored signal, in order to obtain a phasor representation, will therefore not be associated with any problem related to the current transformer saturation.

One technique with the aim of fully reconstructing the secondary current waveform is described in WO93/13581, where the current waveform is partly restored through modelling the current transformer behaviour.

Other prior art documents describing this and similar approaches are U.S. Pat. No. 6,072,310, US2005/0140352 and U.S. Pat. No. 6,040,689.

An alternative technique is based on Artificial Neural Networks. The technique includes "training" of the neural network. This is for instance described in EP 0 980 129. Training of neural networks may however be impractical in a commercial application.

The perhaps most viable of complete signal reconstruction methods is based on a signal model alone, such as described by Kang et al. in "A compensation Algorithm for the Distorted Secondary Current of a Current Transformer", Eighth IEEE International Conference on Development in Power System Protection, 2004, page 140-143.

Typically signal reconstruction may be based on autoregression. One document describing such a technique is "Autoregressive Model-based Compensation Method for the Saturated Secondary Current of a Current Transformer", D-G Lee at al., Proceeding (521) European Power and Energy Systems, 2006, page 287-291.

DE 19928192 describes a method for reconstructing a whole signal waveform using unsaturated current samples, apparently by using detected extreme points from the unsaturated part of the signal.

All these techniques, aiming at fully reconstructing the secondary waveform, are more or less demanding with respect to digital processing resources. The processing power is in many situations limited and it may be desirable to use this limited processing capability to other more urgent uses such as detecting a fault, determining type of fault, determining distance to fault as well as determining various corrective actions to a fault.

Hence, there is a need for techniques that can lessen the negative impact of current transformer saturation on phasor estimation while at the same time limiting the required processing resources.

SUMMARY OF THE INVENTION

The present invention is directed towards providing a solution to the problem of determining at least one property of a current running through the primary winding of a transformer operating in saturation using limited processing resources.

The invention attacks this problem through determining one property of the current in the primary winding, the phase angle, based on a comparison of a detected reliable extreme point of the secondary winding with an absolute time reference.

This should be compared with the traditional way of determining the phase angle through first fully restoring the portions of the secondary current waveform that deviate from the waveform of the current in the primary winding followed by filtering of the restored signal.

One object of the present invention is therefore to provide a method for determining at least one property of a current running through the primary winding of a transformer operating in saturation using an unreliable detected current running through the secondary winding of the transformer, which method uses limited processing resources.

This object is according to a first aspect of the present invention solved through a method for determining at least one property of a current running through the primary winding of a transformer operating in saturation using an unreliable detected current running through the secondary winding of the transformer, comprising the steps of: detecting a first reliable extreme point of a cycle of the current in the secondary winding, comparing the occurrence in time of the reliable extreme point with an absolute time reference, and determining a first property of the current running through the primary winding in the form of the phase angle based on the comparison.

Another object of the present invention is to provide a device for determining at least one property of a current running through the primary winding of a transformer operating in saturation using an unreliable detected current running through the secondary winding of the transformer, which can perform this determination using limited processing resources.

This object is according to a second aspect of the present invention solved through a device for determining at least one property of a current running through the primary winding of a transformer operating in saturation using an unreliable detected current running through the secondary winding of the transformer, comprising: a current detecting unit arranged to detect currents running in the secondary winding of the transformer, and a current property determining unit arranged to detect a first reliable extreme point of a cycle of the current in the secondary winding, compare the occurrence in time of the reliable extreme point with an absolute time reference, and determine a first property of the current running through the primary winding in the form of the phase angle based on the comparison.

Another object of the present invention is to provide a computer program product for determining at least one property of a current running through the primary winding of a transformer operating in saturation using an unreliable detected current running through the secondary winding of the transformer, which allows this determination to be performed using limited processing resources.

This object is according to a third aspect of the present invention solved through a computer program product provided on a data carrier for determining at least one property of a current running through the primary winding of a transformer operating in saturation using an unreliable detected current running through the secondary winding of the transformer, comprising computer program code arranged to make a device or current property determining unit to, when the code is loaded into the device or current property determining unit, detect a first reliable extreme point of a cycle of the current in the secondary winding, compare the occurrence in time of the reliable extreme point with an absolute time reference, and determine a first property of the current running through the primary winding in the form of the phase angle based on the comparison.

According to one variation of the present invention a second extreme point in the cycle of the current in the secondary winding is obtained and then used for determining the amplitude of the current in the primary winding. The second extreme point can here be determined through predicting the current running in the secondary winding from the start of a first intermittent time interval of the cycle when the transformer is in a saturated state. The second extreme point can as an alternative be detected before the transformer started to operate in saturation.

The present invention has a number of advantages. It allows the determination of at least one property of the current in the primary winding of a saturated transformer with small amounts of processing power. It furthermore does this in a relatively fast way. There is little or no need for predicting the current in the secondary winding. Filtering of the current signal is also avoided.

BRIEF DESCRIPTION OF THE DRAWINGS

The present invention will in the following be described with reference being made to the accompanying drawings, where FIG. 1 schematically shows the device according to the present invention being connected to a current transformer provided in an electrical power line.

DETAILED DESCRIPTION OF THE INVENTION

In the following, a detailed description of preferred embodiments of a device and a method according to the present invention will be given.

Figure 1:
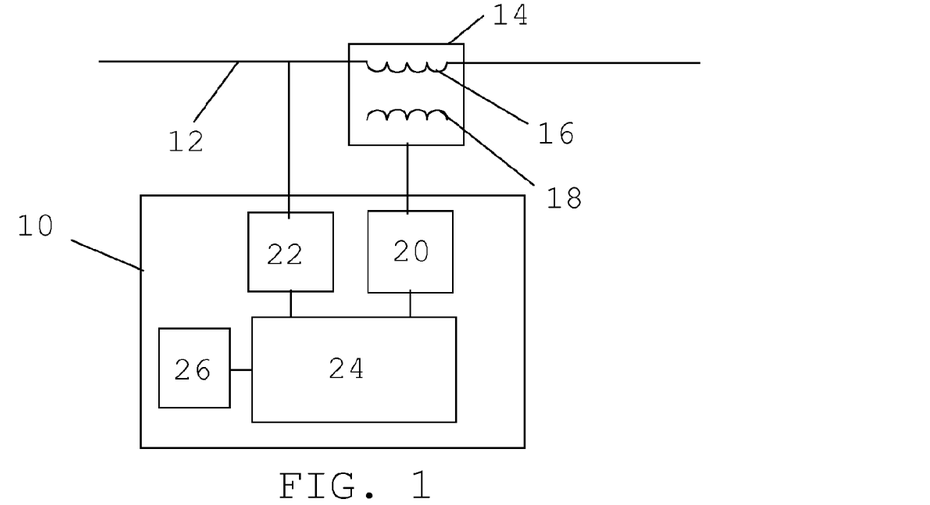

In FIG. 1 there is shown a device 10 for determining at least one property of a current running through the primary winding of a transformer operating in saturation. The device 10 is in the present embodiment provided as a part of a protective relay. The device 10 is connected to a current transformer 14 provided in relation to a piece of equipment in a power system, which piece of equipment is here a power line 12. The current transformer 14 therefore has a primary winding 16 connected in this power line and a secondary winding 18.

The device 10 includes a current detecting unit 20, which detects the current in the secondary winding 18 of the transformer 14, and a voltage detecting unit 22, which is connected to the power line 12 through a voltage instrument transformer (not shown) at the transformer 14. Both these detecting units 20 and 22 are connected to a current property determining unit 24. The current property determining unit 24 is furthermore connected to a store 26.

Figure 2:
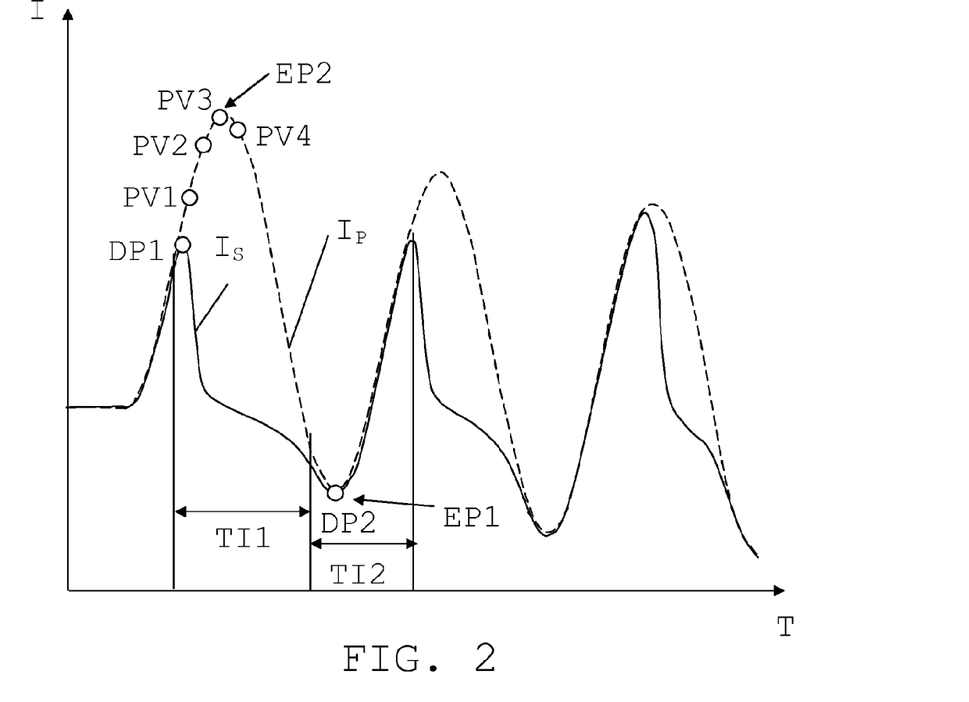
FIG. 2 schematically shows a diagram of the current in the primary winding of the transformer as well as the current in the secondary winding of the transformer when the transformer is operating in saturation.

FIG. 2 shows a diagram outlining the waveform of the current $I_3$ in the secondary winding of the transformer, shown as the transformer has started to operate in saturation, together with the corresponding current $I_P$ in the primary winding. The two currents have here been scaled in order to show their relation to each other. Naturally the primary current $I_P$ is normally much larger than the secondary current $I_S$. The current $I_3$ in the secondary winding is furthermore shown as a solid line, while the current $I_P$ in the primary winding is shown with a dashed line. Both currents are cyclic and in the diagram three cycles of each current is shown. In a first cycle of this secondary current $I_3$ there is furthermore shown a first detected point DP1 and a second detected point DP2, which second detected point DP2 is also a first reliable extreme point EP1. It should be realized that the first and the second detected points DP1 and DP2 are the only ones shown in order to better describe the present invention.

Therefore more points on the secondary current may be detected than these two indicated points. In the first cycle of the primary current $I_P$ there are shown a number of predicted current values PV1, PV2, PV3 and PV4, where the third value PV3 is a second extreme point EP2 and all these predicted values are provided in a first intermittent time interval TI1, which is then followed by a second intermittent time interval TI2 where the first reliable extreme point EP1 is provided. The first intermittent time interval TI1 is here a time interval in the first cycle when the transformer is in a saturated state, i.e. the transformed waveform is distorted, while the second intermittent time interval TI2 is a time interval in the first cycle when the transformer is not in a saturated state, i.e. the transformed waveform is undistorted.

Figure 3:
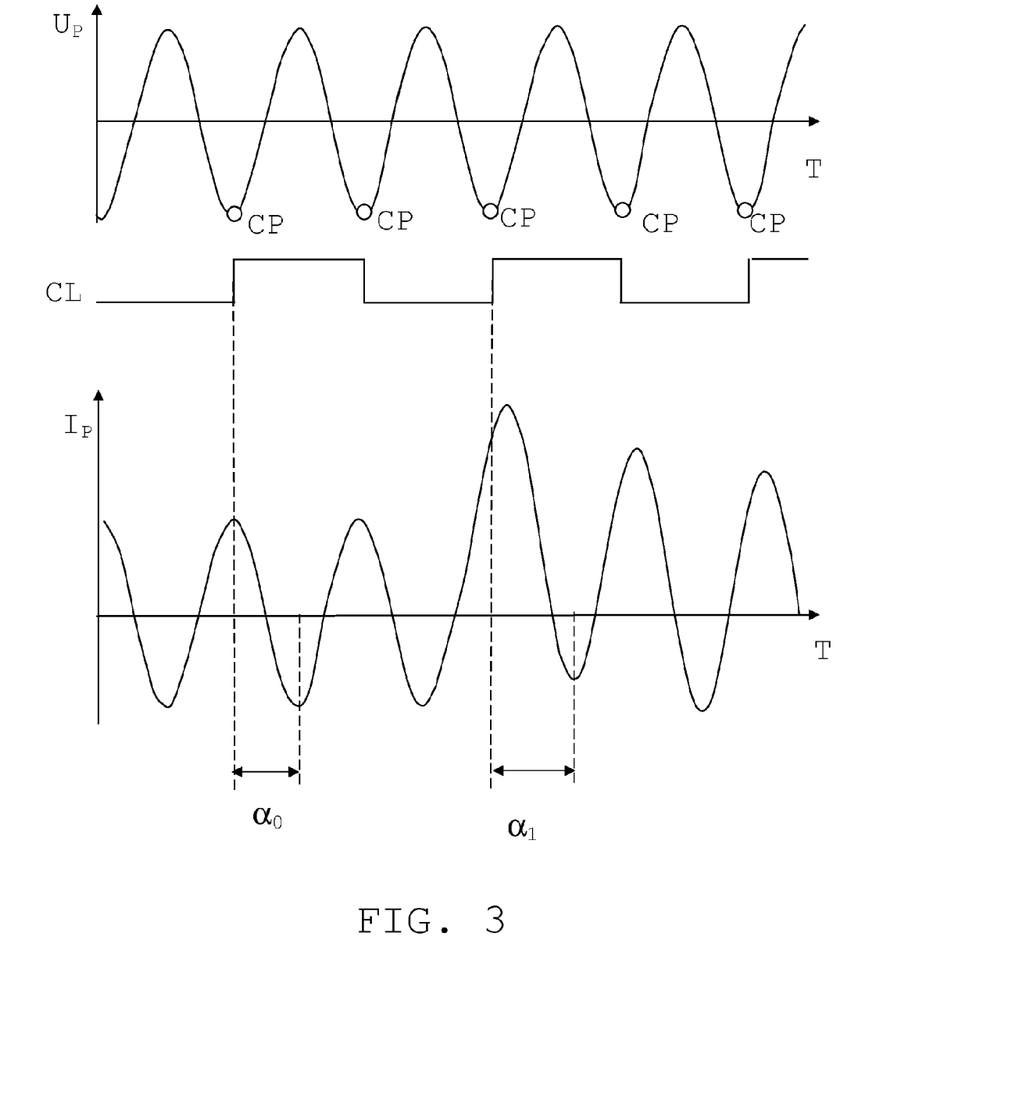
FIG. 3 schematically shows a diagram of the voltage at the primary winding of the transformer, a related clocking signal and the current in the primary winding of the transformer before and after the transformer has started to operate in saturation, and FIG. 4 schematically shows a number of method steps being taken in a method according to the present invention.

FIG. 3 shows the voltage $U_P$ at the primary winding of the transformer over time before and after the transformer has started to operate in saturation. This voltage is cyclic and furthermore also periodic. FIG. 3 also shows the current $I_P$ in the primary winding before and after the transformer has started to operate in saturation. That is it has started to operate in saturation as be seen through the amplitude being raised as the well as through the introduction of an exponentially decreasing DC-component. In the drawing there is furthermore shown a number of specific time positions of the voltage $U_P$ in the period of this voltage, here the minimum voltage CP, as well as a number of clock pulses CL being generated based on these regularly recurring curve positions levels. A nominal phase CCo associated with the current before the transformer has started to operate in saturation as well as a phase CCi associated with the current after the transformer has started to operate in saturation are also shown.

Figure 4:
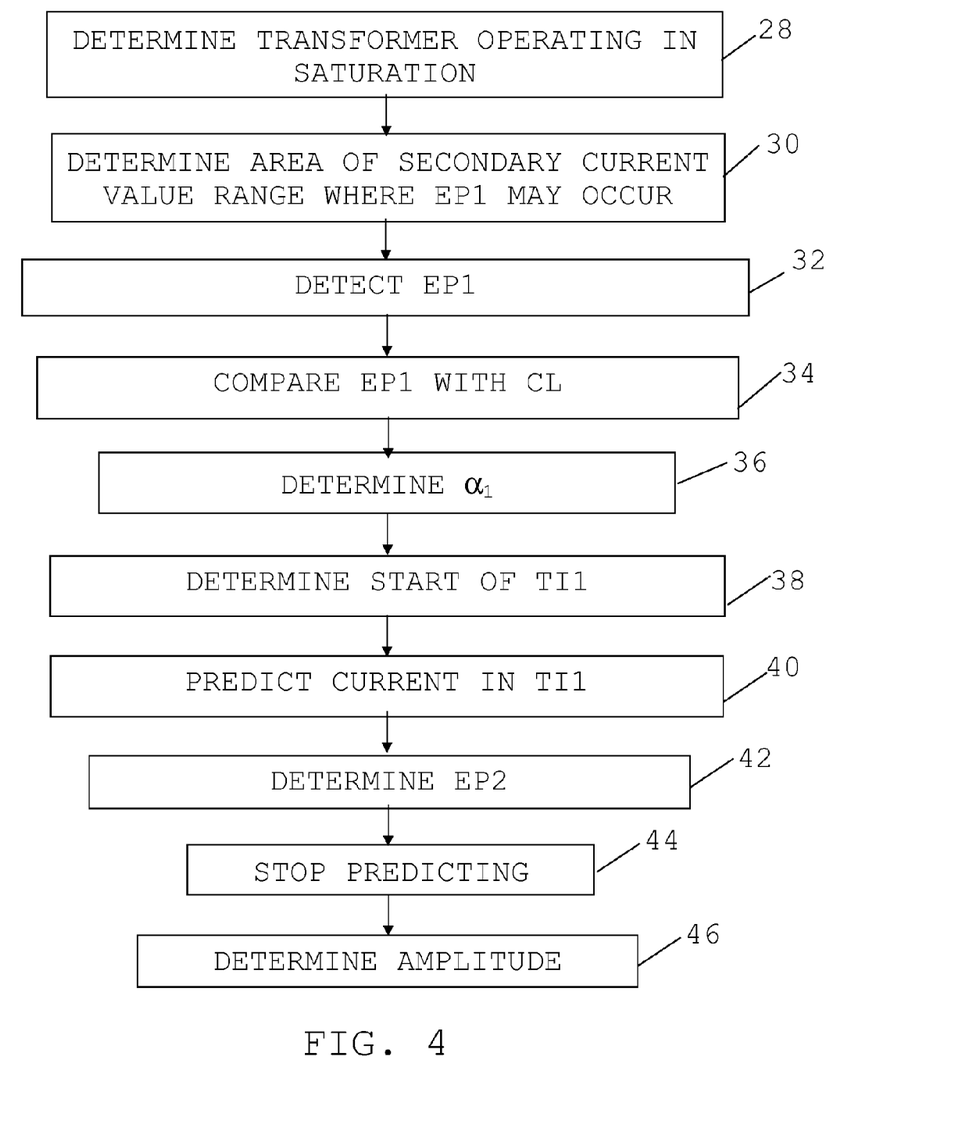

In the following the functioning of the present invention will be described in more detail with reference being made to the above-mentioned FIGS. 1-3 as well as to FIG. 4, which shows a flow chart of a number of method steps being performed in a method according to the present invention.

The invention relates to a protective device in electrical power systems; that is, an apparatus, like a protective relay or an IED, that can quickly detect abnormal conditions and take appropriate action, like disconnecting the part of the system that causes the abnormal condition. Examples of typical objects that can be monitored by such a device are switches, transformers and power lines. In FIG. 1 one such power system object in the form of a power line 12 is shown. The protective device typically contains functionality to test the system conditions through comparing system quantities against thresholds. One such system quantity may be the current. In doing this the phasor of the signal is often used. Two properties of the current, the magnitude and phase angle, may therefore be used as indicators of the system condition, either singly or jointly. It is therefore essential that they are estimated. The present invention is directed towards providing a method and a device for determining at least one of these properties, and then at least the phase angle. This device is as was mentioned earlier here provided as a part of a protective device like a protective relay. However, it should be realized that it may as an alternative be provided as a separate device.

The current running in such an object as mentioned above is in many cases so large that it cannot be measured directly, a current transformer has to be used. In such monitoring the current is detected by the current detecting unit 20 of the device 10 via the secondary winding 18 of the transformer 14 and often also the voltage of the power line 12 is detected via a voltage detecting unit 22 of the device 10. These quantities are detected in order to for instance monitor faults in the power system.

The current transformer 14 is dimensioned for operating satisfactory during normal conditions, i.e. when for instance the current in the power line 12 lies within well-defined current limits. However, if a fault occurs, the current may have values that go beyond the limits for which the transformer has been dimensioned. In this case the transformer 14 will start to operate in saturation when the current $I_3$ in the secondary winding 18 of the transformer 14 is unreliable. This is exemplified in FIG. 2, where it can be seen that the current $I_3$ in the secondary winding 18 does not resemble the current $I_P$ in the primary winding 16. The current is distorted. Hence the current running in the object 12 is not properly detected, which may negatively influence the monitoring of this current, which in turn may lead to the wrong actions being performed or no action being performed when a fault occurs. The present invention is directed towards remedying this in a simple and economical fashion.

The present invention furthermore takes advantage of the fact that when the transformer is operating in saturation, it will not always be saturated, some parts of the current or signal is correct and may be used.

Due to current transformer dimensioning practice, only the positive or negative part of the waveform is expected be subject to distortion from the saturation, not both of them at the same time. Thus, assuming the waveform is essentially a sinusoidal signal, at least one part of the cycle is unaffected by the saturation and this is used in determining properties of the current.

It is thus necessary to determine which part is unaffected. This can be done with a variety of known techniques, of which some will be described below.

In order to be able to perform the method steps of the present invention the device 10 furthermore has to provide an absolute time reference CL, which with advantage is associated with the period of a periodic signal measured at the primary winding before the transformer started to operate in saturation. This periodic signal may with advantage be the voltage $U_P$ of the power line 12 at the primary winding 16 of the transformer 14. The voltage is usually available in some form even during a fault and therefore it may be used for a reference also after the transformer has started to operate in saturation. The time reference may furthermore be associated with a specific position, a clock position CP, in the period of this periodic signal. In the present example it is the minimum voltage of the voltage $U_P$ at the primary winding 16 that is used as a clock position CP. It should be realized that any other point within the period may be used. It should also be realized that in a similar fashion it is possible to use also a position on the current being detected before saturation occurred. However, it may then not be used after the transformer has started to operate in saturation.

This clock position CP is then used for generating a clock signal CL that provides the absolute time reference. This clock signal CL may be generated by the current property determining unit 24 in the following way. The current property determining unit 24 may continuously receive voltages measured by the voltage detecting unit 22 and compare these with a threshold that corresponds to the minimum voltage of the power line 12 at the primary winding 16. Each time that the voltage reaches the threshold a clocking pulse is generated. In this way the absolute time reference CL is provided. It is here also possible to use the store 26 for storing data concerning the absolute time reference.

The actual method starts with the current property determining unit 24 detecting that the transformer has started to operate in saturation, step 28. This may be done according to the principles mentioned in EP 0 506 035, which document is herein incorporated by reference. It may in more detail be done through detecting the current at a certain point in time, integrating the current at the same point in time, comparing the absolute value of the current with a first threshold, comparing the absolute value of the derivate of the current with a second threshold and comparing the absolute value of the current a short time, typically a few ms, before the above-mentioned certain point in time, with a third threshold and determining that the transformer is in saturation if the first and second thresholds are not exceeded, while the third is. Here the first threshold may be set to one or a few percent of the rated value of the current, the second threshold may be set to one or a few percent of the maximum value of the derivative of the current at sinusoidal waveform and the third threshold may be set as a value near the rating of the current transformer.

Thereafter the current property determining unit 24 determines an area of the detectable secondary current value range in which a first reliable extreme point EP1 occurs, step 30. It may here be a determining of in which half of the detectable secondary current value range where the first reliable extreme point EP1 occurs. This may be done through also investigating the sign or polarity (i.e. direction) of the current and possibly also the sign or polarity of the derivative of the current that were used in detecting saturation. In this way the current values that are detected in the secondary winding can be classified. The current values detected around the point in time of the detection of saturation will then be in an area where no reliable extreme point can be detected, here exemplified by the first detected point DP1, while the current values being detected with an opposite sign or polarity, here exemplified by the second detected point DP2, will be in an area where a reliable extreme point can be detected. In this way it is possible to determine that the transformer operates in saturation, and also the area of the detectable current value range where a reliable extreme point may be detected.

It should be realized that this was only one way to make the determinations mentioned above. It is equally as well possible to make them through estimating the transformer core flux, based on the waveform of the current in the secondary winding.

As the current property determining unit 24 now has determined the general area of the first reliable extreme point, it is possible to directly detect it, i.e. the extreme point EP1 where the transformer is not operating in saturation in the cycle, step 32, through detecting which current value is the minimum current value (if this extreme point has negative polarity) or alternatively the maximum value. In the present example it is a minimum value. Thereafter the current property determining unit 24 compares the occurrence in time of the first reliable extreme point EP1 with the absolute time reference CL, step 34, and determines the phase angle CCi through this comparison, step 36. Here it may be possible that this phase angle CCi is provided in relation to the nominal phase angle CCo, for instance as the difference, so that the change in phase angle is obtained.

This phase angle CCi or first property of the current running in the primary winding of the transformer is in many safety applications all that is needed. The phase angle CCi is thus here obtained without having to perform any predictions of the shape of the current in the secondary winding 18. In this way a major saving of processing power may be made, which saved processing power may be used for other purposes, for instance in relation to analyzing causes of and providing counter-measures against faults.

It is in some instances of advantage to also obtain another property of the current, namely the amplitude. In order to do this the current property determining unit 24 may first determine the start of the first intermittent time interval TII, step 38. This may actually with advantage be made simultaneously with the determining of an area of the detectable secondary current value range where the reliable extreme point is to be found. Because of the nature of saturation of transformers, such a second unreliable extreme point of the secondary current detected at the point in time when saturation is also being detected, such as the first detected point DP1 in FIG. 2, will in fact not correspond to an extreme point at all of the current in the primary winding. However, it will enable the determining of the starting point of the first intermittent time interval TII. According to the present invention, a prediction of the current may therefore be made starting at the point in time of detection of this first detected value DP1 in the cycle of the secondary current. The current in the first intermittent time interval TII is therefore predicted from the start of the interval, step 40. In FIG. 2 four such predicted values PV1, PV2, PV3 and PV4 are shown. Such prediction may be performed using well-known auto-regression techniques. Through this prediction an actual reconstructed second extreme point EP2 is then determined, step 42, which here corresponds to the maximum of the primary current. That the second extreme point EP2 has been reached may easily be identified since the predicted values before and after it, PV2 and PV4, will be lower (if it is a maximum) or higher (if it is a minimum). As soon as the second extreme point EP2 has been determined, the prediction is then stopped, step 44. Based on the two extreme points EP1 and EP2 it is then a simple matter to determine an approximation of the amplitude of the signal, step 46, i.e. the amplitude of the current in the primary winding. This is normally determined based on the difference between the two extreme points EP1 and EP2. The method may thereafter be repeated in the same manner for the following cycles while the transformer is still operating in saturation In this way it is therefore possible to obtain the whole phasor of this particular signal that may be needed for fault determination and fault location objectives. This is furthermore done with a limited amount of additional processing power that is still far below the processing power needed to reconstruct the whole signal.

The present invention thus allows the determination of at least one property of the current in the primary winding of a saturated transformer using small amounts of processing power. The invention furthermore does this in a relatively fast way. There is little or no need for predicting the current in the secondary winding. Filtering of the current signal is also avoided.

The current property determining unit in the device according to the present invention may be provided through a processor together with a memory including computer program code implementing the functionality of this unit, while the voltage and current detecting units may be realized through standard current and voltage detectors. The store may be any suitable memory such as a RAM memory, of the above-mentioned computer program code may in fact be provided in the form of a computer program product comprising said computer program code provided on a computer readable medium, such on a CD ROM or other type of storage medium, and being configured to make a device perform, when said code is loaded into said device, the functionality of the current property determining unit described above.

The present invention may be varied in a number of ways. In case a voltage is used for providing an absolute time reference, the store may be omitted. In case the current is used for obtaining the time reference the voltage detecting unit may be omitted. As mentioned before it is possible to only determine the phase angle and not the amplitude in case the amplitude is not needed. This may also be done in case the saturation is not so severe. In this case it is be possible to set the above-mentioned first detected point to be the second extreme point. It is furthermore possible that the second extreme point of the cycle occurs before the transformer starts to operate in saturation. In this case it is possible to directly detect this second extreme point, which is thus also reliable. In this special case there is furthermore no need for a prediction of current in the cycle in question.

From the foregoing discussion it is evident that the present invention can be varied in a multitude of ways It shall consequently be realized that the present invention is only to be limited by the following claims.

What is claimed is:

1. A method for determining at least one property of a current ($I_P$) running through a primary winding of a transformer operating in saturation using an unreliable detected current ($I_S$) running through a secondary winding of said transformer, comprising the steps of:
    detecting a first reliable extreme point (EP1) of a cycle of the current in the secondary winding,
    comparing the occurrence in time of the reliable extreme point (EP1) with an absolute time reference (CL), where the absolute time reference (CL) is a reference associated with a period of a periodic signal ($U_P$) measured at the primary winding at least before the transformer started to operate in saturation,
    determining a first property of the current running through the primary winding in the form of a phase angle ($\alpha_1$) based on the comparison,
    obtaining a second extreme point (EP2) in said cycle of the current in the secondary winding, and
    determining a second property of the current running through the primary winding in the form of an amplitude based on the two extreme points (EP1, EP2) of the cycle,
    wherein the step of obtaining a second extreme point comprises determining a second reconstructed extreme point (EP2) in said cycle of the current in the secondary winding, which second extreme point occurs during a first intermittent time interval (TI1) of the cycle when the transformer is in a saturated state and which determination is made through predicting the current running in the secondary winding from the start of the first intermittent time interval and the prediction is stopped as soon as the second extreme point (EP2) has been determined.

2. The method according to claim 1, further comprising the step of determining an area of a detectable secondary current value range, where said first reliable extreme point (EP1) can be detected.

3. The method according to claim 2, wherein the determining of said area is based on a polarity of the detected current as the trans-former is determined to be operating in saturation.

4. The method according to claim 1, wherein the signal is a voltage ($U_P$) measured at the primary winding of the transformer.

5. The method according to claim 1, wherein the step of obtaining a second extreme point comprises detecting a second reliable extreme point of the cycle occurring before the transformer started to operate in saturation.

6. The method according to claim 1, further comprising the step of using at least one of the determined current properties in evaluating a fault of a power system in which said transformer is provided.

7. A device for determining at least one property of a current ($I_P$) running through a primary winding of a transformer operating in saturation using an unreliable detected current ($I_S$) running through a secondary winding of said transformer, comprising:
    a current detecting unit arranged to detect currents running in the secondary winding of the transformer, and
    a current property determining unit arranged to:
        detect a first reliable extreme point ($EP_1$) of a cycle of the current ($I_S$) in the secondary winding,
        compare the occurrence in time of the reliable extreme point (EP1) with an absolute time reference (CL), where the absolute time reference (CL) is a reference associated with a period of a periodic signal measured at the primary winding at least before the transformer started to operate in saturation, and
        determine a first property of the current running through the primary winding in the form of a phase angle ($\alpha_1$) based on the comparison,
        obtain a second extreme point (EP2) in said cycle of the current in the secondary winding, and
        determine a second property of the current running through the primary winding in the form of an amplitude based on the two extreme points (EP1, EP2) of the cycle,
    wherein the current property determining unit when obtaining a second extreme point is arranged to determine a second reconstructed extreme point (EP2) in said cycle of the current in the secondary winding, which second extreme point occurs during a first intermittent time interval (TI1) of the cycle when the transformer is in a saturated state, and determination is made through predicting the current running in the secondary winding from the start of the first intermittent time interval and to stop the prediction as soon as the second extreme point has been determined.

8. The device according to claim 7, wherein the current property determining unit is further arranged to determine an area of a detectable secondary current value range, where said first reliable extreme point (EP1) can be detected.

9. The device according to claim 8, wherein the determining of said area is based on a polarity of the detected current as the transformer is determined to be operating in saturation.

10. The device according to claim 9, wherein the periodic signal is a voltage ($U_P$) measured at the primary winding of the transformer by a voltage detecting unit.

11. The device according to claim 7, wherein the current property determining unit when obtaining a second extreme point is arranged to detect a second reliable extreme point of the cycle occurring before the transformer started to operate in saturation.

12. The device according to claim 7, where the device is a protective relay and being further arranged to use at least one of the determined current properties in evaluating a fault of a power system in which said transformer is provided.

13. A computer program product provided on a memory for determining at least one property of a current ($I_P$) running through a primary winding of a transformer operating in saturation using an unreliable detected current ($I_S$) running through a secondary winding of said transformer, comprising:
    computer program code arranged to make a device or current property determining unit, when said code is loaded into the device or current property determining unit:
        detect a first reliable extreme point (EP1) of a cycle of the current ($I_S$) in the secondary winding,
        compare the occurrence in time of the reliable extreme point (EP1) with an absolute time reference (CL), where the absolute time reference (CL) is a reference associated with a period of a periodic signal measured at the primary winding at least before the transformer started to operate in saturation, determine a first property of the current running through the primary winding in the form of a phase angle ($\alpha_1$) based on the comparison, obtain a second extreme point (EP2) in said cycle of the current in the secondary winding, and determine a second property of the current running through the primary winding in the form of a amplitude based on the two extreme points (EP1, EP2) of the cycle, wherein the obtaining of a second extreme point comprises determining a second reconstructed extreme point (EP2) in said cycle of the current in the secondary winding, which second extreme point occurs during a first intermittent time interval (TI1) of the cycle when the transformer is in a saturated state and which determination is made through predicting the current running in the secondary winding from the start of the first intermittent time interval and the prediction is stopped as soon as the second extreme point (EP2) has been determined.

* * * * *

UNITED STATES PATENT AND TRADEMARK OFFICE
CERTIFICATE OF CORRECTION

PATENT NO. : 8,395,373 B2
APPLICATION NO. : 12/892607
DATED : March 12, 2013
INVENTOR(S) : Magnus Akke et al.

It is certified that error appears in the above-identified patent and that said Letters Patent is hereby corrected as shown below:

Title Page, Item (75) Inventors: "Lund" should read --Kingston--.

Signed and Sealed this
Twenty-first Day of May, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,395,373 B2 | Page 1 of 1 |
| APPLICATION NO. | : 12/892607 | |
| DATED | : March 12, 2013 | |
| INVENTOR(S) | : Magnus Akke et al. | |

It is certified that error appears in the above-identified patent and that said Letters Patent is hereby corrected as shown below:

Title Page, Item (75) Inventors: "Lund" should read --Klagstorp--.

This certificate supersedes the Certificate of Correction issued May 21, 2013.

Signed and Sealed this
Twentieth Day of August, 2013

Teresa Stanek Rea
*Acting Director of the United States Patent and Trademark Office*